US012628707B2

(12) United States Patent
Kim et al.

(10) Patent No.: US 12,628,707 B2
(45) Date of Patent: May 12, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Byungwook Kim, Suwon-si (KR); Ayoung Kim, Yongin-si (KR); Seongwon Jeong, Seoul (KR); Sangsu Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1026 days.

(21) Appl. No.: 17/743,971

(22) Filed: May 13, 2022

(65) Prior Publication Data

US 2023/0130436 A1    Apr. 27, 2023

(30) Foreign Application Priority Data

Oct. 25, 2021    (KR) ........................ 10-2021-0142824

(51) Int. Cl.
*H10W 90/00*        (2026.01)
*H10W 70/685*        (2026.01)
(52) U.S. Cl.
CPC ....... *H10W 90/701* (2026.01); *H10W 70/685* (2026.01); *H10W 90/724* (2026.01)
(58) Field of Classification Search
None
See application file for complete search history.

(56) References Cited

U.S. PATENT DOCUMENTS

| | | | |
|---|---|---|---|
| 6,879,041 B2 | 4/2005 | Yamamoto et al. | |
| 6,933,216 B2 | 8/2005 | Sakata et al. | |
| 8,395,051 B2 | 3/2013 | Pang et al. | |
| 8,562,906 B2 | 10/2013 | Tanaka et al. | |
| 9,150,452 B2 | 10/2015 | Ong et al. | |
| 9,333,685 B2 | 5/2016 | Ong et al. | |
| 9,365,453 B2 | 6/2016 | Ong et al. | |
| 9,586,348 B2 | 3/2017 | Ong et al. | |
| 9,607,964 B2 | 3/2017 | Karhade et al. | |
| 10,930,611 B1 | 2/2021 | Gandhi et al. | |
| 2004/0177977 A1* | 9/2004 | Hansen | F15B 9/09 |
| | | | 701/50 |

(Continued)

FOREIGN PATENT DOCUMENTS

| | | |
|---|---|---|
| KR | 20030053159 A | 6/2003 |
| KR | 1020140036939 A | 3/2014 |

(Continued)

*Primary Examiner* — Erik T. K. Peterson
(74) *Attorney, Agent, or Firm* — Muir Patent Law, PLLC

(57)    ABSTRACT

A semiconductor package includes a package substrate having a first surface and a second surface opposite to the first surface, and including a plurality of bonding pads exposed to the first surface and a plurality of solder bumps respectively disposed on the bonding pads, and at least one semiconductor device arranged on the package substrate. Each of the solder bumps includes a bump body disposed on the bonding pad, a plurality of bonding particles provided inside the bump body to be adjacent to the bonding pad, and a first metal compound layer provided to surround the bonding particles and having a protrusion structure for strengthening adhesion with the bonding pad.

20 Claims, 17 Drawing Sheets

10

(56)                 References Cited

U.S. PATENT DOCUMENTS

| | | | |
|---|---|---|---|
| 2006/0202322 A1* | 9/2006 | Kariya | H05K 1/0271 |
| | | | 257/701 |
| 2010/0291399 A1* | 11/2010 | Kato | C22C 1/04 |
| | | | 228/141.1 |
| 2011/0012263 A1* | 1/2011 | Hata | H01L 24/11 |
| | | | 257/772 |
| 2011/0221056 A1 | 9/2011 | Miyaji et al. | |
| 2013/0221521 A1* | 8/2013 | Yang | H01L 24/81 |
| | | | 257/737 |
| 2013/0280364 A1 | 10/2013 | Ong et al. | |
| 2014/0131856 A1* | 5/2014 | Do | H01L 23/5384 |
| | | | 257/737 |
| 2014/0131898 A1* | 5/2014 | Shearer | H01L 24/83 |
| | | | 257/783 |
| 2015/0041969 A1* | 2/2015 | Chang | H01L 25/0655 |
| | | | 257/734 |
| 2015/0091162 A1* | 4/2015 | Murayama | H01L 24/81 |
| | | | 257/737 |
| 2015/0115020 A1 | 4/2015 | Taniguro | |
| 2015/0361002 A1 | 12/2015 | Ong et al. | |
| 2016/0129530 A1* | 5/2016 | Greve | B23K 35/262 |
| | | | 75/228 |
| 2016/0297029 A1* | 10/2016 | Ishino | B23K 20/002 |
| 2016/0379915 A1* | 12/2016 | Lee | H01L 23/49822 |
| | | | 257/737 |
| 2017/0033027 A1* | 2/2017 | Chen | H01L 23/5384 |
| 2017/0259366 A1 | 9/2017 | Ishikawa et al. | |
| 2018/0117715 A1* | 5/2018 | Momokawa | H05K 3/3463 |
| 2018/0166411 A1* | 6/2018 | Hine | C22C 13/00 |
| 2020/0043888 A1* | 2/2020 | Tatsumi | H01L 24/83 |
| 2020/0066639 A1* | 2/2020 | Lee | H01L 23/5386 |
| 2022/0274212 A1* | 9/2022 | Nishimura | C22C 9/06 |
| 2022/0297243 A1* | 9/2022 | Nishimura | B23K 35/025 |
| 2023/0137877 A1* | 5/2023 | Shan | H01L 25/0657 |
| | | | 257/741 |
| 2023/0395551 A1* | 12/2023 | Kishimoto | B22F 3/24 |

FOREIGN PATENT DOCUMENTS

| | | | |
|---|---|---|---|
| KR | 20140067764 A | 6/2014 | |
| KR | 101686312 B1 | 12/2016 | |
| KR | 1020190011125 A | 2/2019 | |

* cited by examiner

THIRD DIRECTION

FIRST DIRECTION $y=-140.65x+3773.8$

FRACTURE PULL F(g)

Cu$_3$Sn THICKNESS (um)

$y=-217.17x+3544.7$

FRACTURE SHEAR F(g)

Cu$_3$Sn THICKNESS (um)

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2021-0142824, filed on Oct. 25, 2021, in the Korean Intellectual Property Office (KIPO), the contents of which are herein incorporated by reference in its entirety.

BACKGROUND

1. Field

Example embodiments relate to a semiconductor package and a method of manufacturing the semiconductor package. More particularly, example embodiments relate to a semiconductor package including a plurality of different semiconductor devices stacked on a package substrate and a method of manufacturing the same.

2. Description of the Related Art

A package substrate includes solder bumps that are bonded to bonding pads (under bump metallurgy) to be electrically connected to semiconductor devices stacked on the package substrate. The solder bump and the bonding pad may include different materials to each other, and an adhesive strength may vary depending on a composition of an intermetallic compound (IMC) formed between the solder bump and the bonding pad in manufacturing processes. When the adhesive strength between the solder bump and the bonding pad is weak, the solder bump may be separated from the package substrate, and thus, the function of the package substrate may not be properly performed and reliability may be reduced.

SUMMARY

Example embodiments provide a semiconductor package including a package substrate having a solder bump structure capable of improving adhesion.

Example embodiments provide a method of manufacturing the semiconductor package.

According to example embodiments, a semiconductor package includes a package substrate having a first surface and a second surface opposite to the first surface, the package substrate including a plurality of bonding pads exposed from the first surface and a plurality of solder bumps respectively disposed on the plurality of bonding pads and at least one semiconductor device arranged on the package substrate. Each of the plurality of solder bumps includes a bump body disposed on the bonding pad, a plurality of bonding particles provided inside the bump body to be adjacent to the bonding pad, and a first metal compound layer provided to surround the plurality of bonding particles, the first metal compound layer having a protrusion structure for strengthening adhesion with the bonding pad.

According to example embodiments, a semiconductor package includes a package substrate having a first surface and a second surface opposite to the first surface, the package substrate including a redistribution wiring layer having redistribution wiring therein, a plurality of bonding pads exposed from the first surface and a plurality of solder bumps respectively disposed on the plurality of bonding pads and first and second semiconductor devices arranged on the second surface of the package substrate to be spaced apart from each other. Each of the plurality of solder bumps includes a bump body disposed on the bonding pad, a plurality of bonding particles provided adjacent to the bonding pad, and a first metal compound layer provided to surround the plurality of bonding particles, the first metal compound layer having a protrusion structure for strengthening adhesion with the bonding pad.

According to example embodiments, a semiconductor package includes a package substrate having a first surface and a second surface opposite to the first surface, the package substrate including a redistribution wiring layer having redistribution wiring therein, a plurality of bonding pads exposed from the first surface and a plurality of solder bumps respectively disposed on the plurality of bonding pads, and first and second semiconductor devices arranged on the second surface of the package substrate. Each of the plurality of solder bumps includes a bump body disposed on the bonding pad, a plurality of bonding particles provided adjacent to the bonding pad, a first metal compound layer provided to surround the bonding particles, and a second metal compound layer provided in contact with the bonding pad. The first and second metal compound layers include a protrusion structure for strengthening adhesion between the plurality of bonding pads and the plurality of solder bumps.

According to example embodiments, a semiconductor package includes a package substrate having a first surface and a second surface opposite to the first surface, the package substrate including a plurality of bonding pads exposed to the first surface and a plurality of solder bumps respectively disposed on the plurality of bonding pads, and at least one semiconductor device arranged on the package substrate, wherein each of the plurality of solder bumps includes a bump body disposed on the bonding pad, a plurality of bonding particles provided inside the bump body to be adjacent to the bonding pad, and a first metal compound layer provided to surround the plurality of bonding particles and having a protrusion structure for strengthening adhesion with the bonding pad.

Thus, the bonding particles may be provided between the bonding pad and the solder bump. As the metal compound layer that surrounds the bonding particles or is provided in contact with the bonding pad has the protrusion structure, a bonding force between the bonding pad and the solder bump may be strengthened. The solder bump may be reliably adhered to the package substrate without being separated from the bonding pad.

BRIEF DESCRIPTION OF THE DRAWINGS

Example embodiments will be more clearly understood from the following detailed description taken in conjunction with the accompanying drawings. FIGS. 1 to 26 represent non-limiting, example embodiments as described herein.

FIG. 1 is a cross-sectional view illustrating a semiconductor package in accordance with example embodiments.

FIG. 2 is an enlarged cross-sectional view illustrating portion 'A' in FIG. 1.

FIG. 3 is an enlarged cross-sectional view illustrating portion 'B' in FIG. 2.

FIG. 4 is an enlarged cross-sectional view illustrating portion 'C' in FIG. 3.

FIG. 5 is an enlarged cross-sectional view illustrating portion 'D' in FIG. 4.

FIG. 6 is an enlarged cross-sectional view illustrating portion 'E' in FIG. 4.

FIGS. 9 to 26 are cross-sectional views illustrating a method of manufacturing a semiconductor package in accordance with example embodiments.

DETAILED DESCRIPTION OF EXAMPLE EMBODIMENTS

Hereinafter, example embodiments will be explained in detail with reference to the accompanying drawings. Like numerals refer to like elements throughout.

Figure 1:
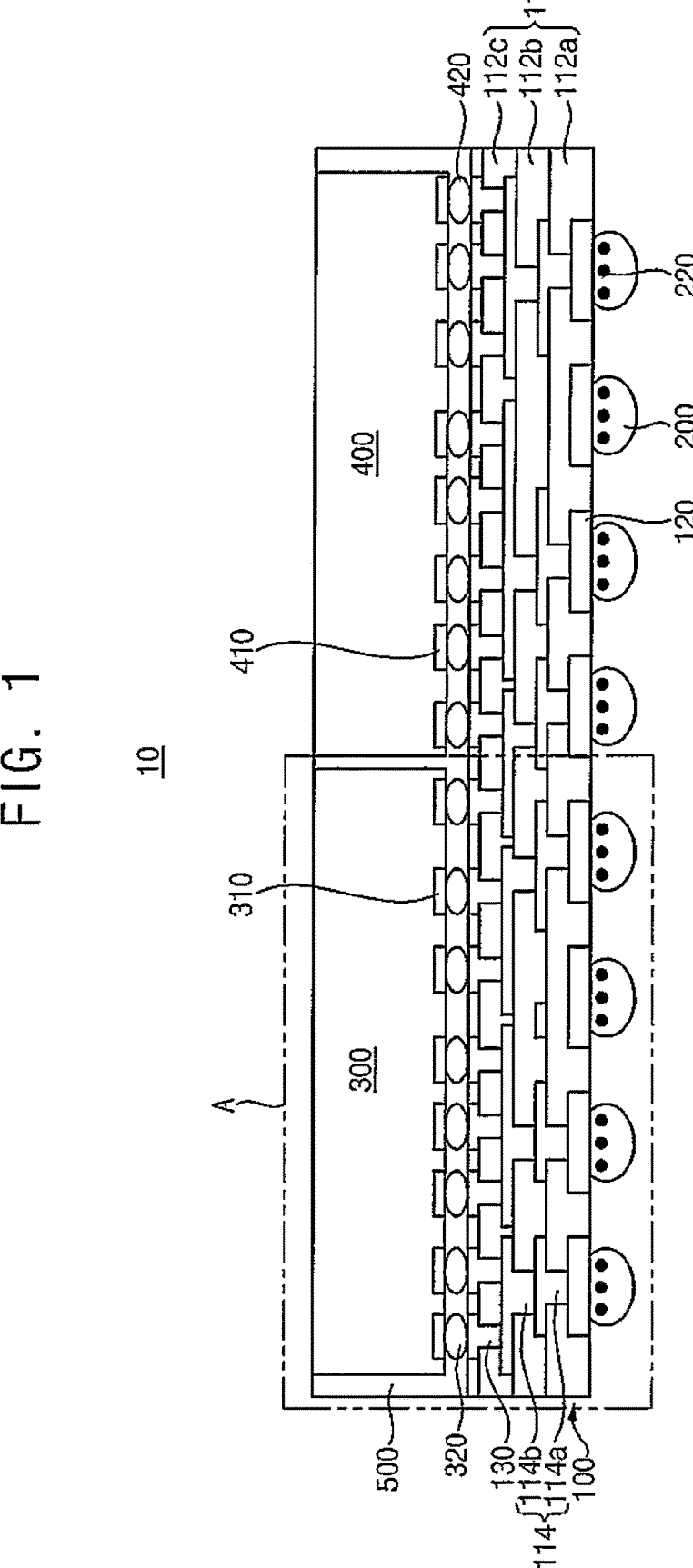
Figure 2:
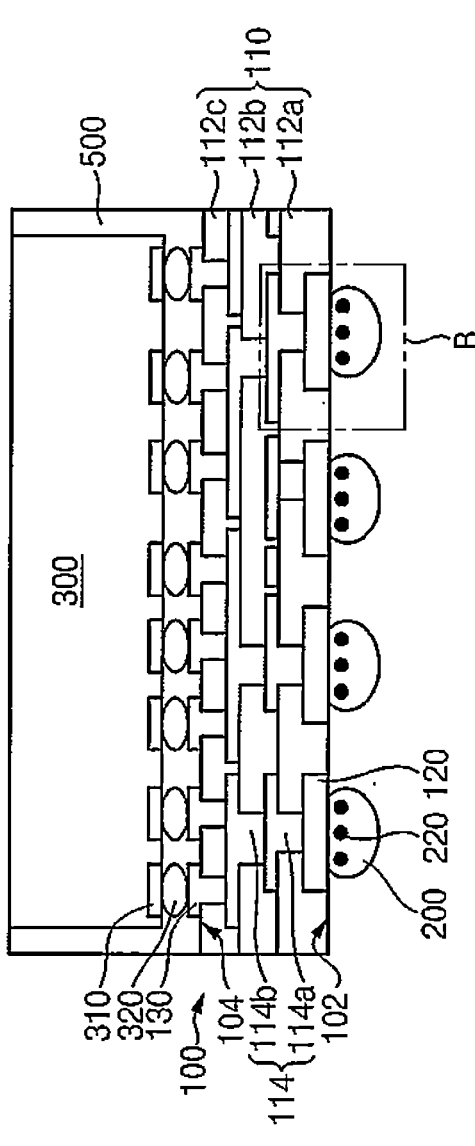
Figure 3:
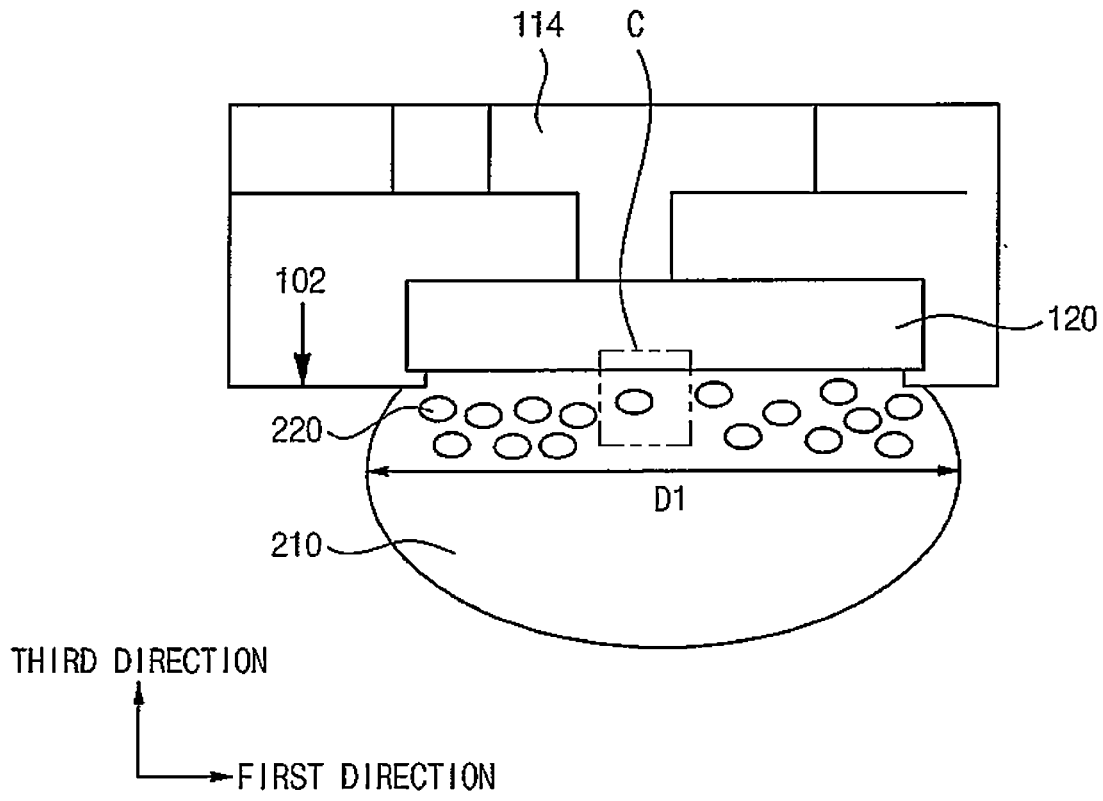
Figure 4:
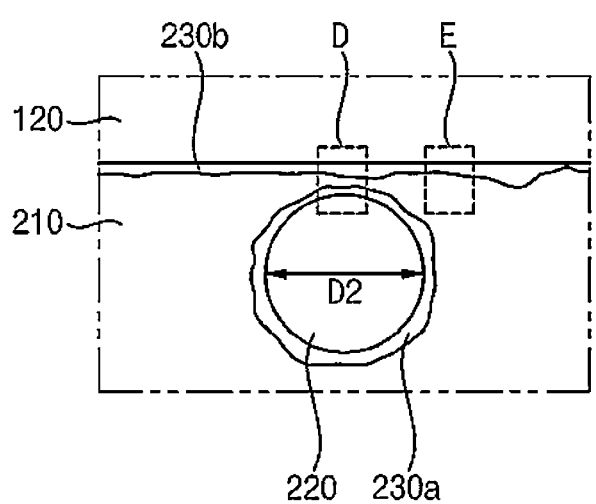
Figure 5:
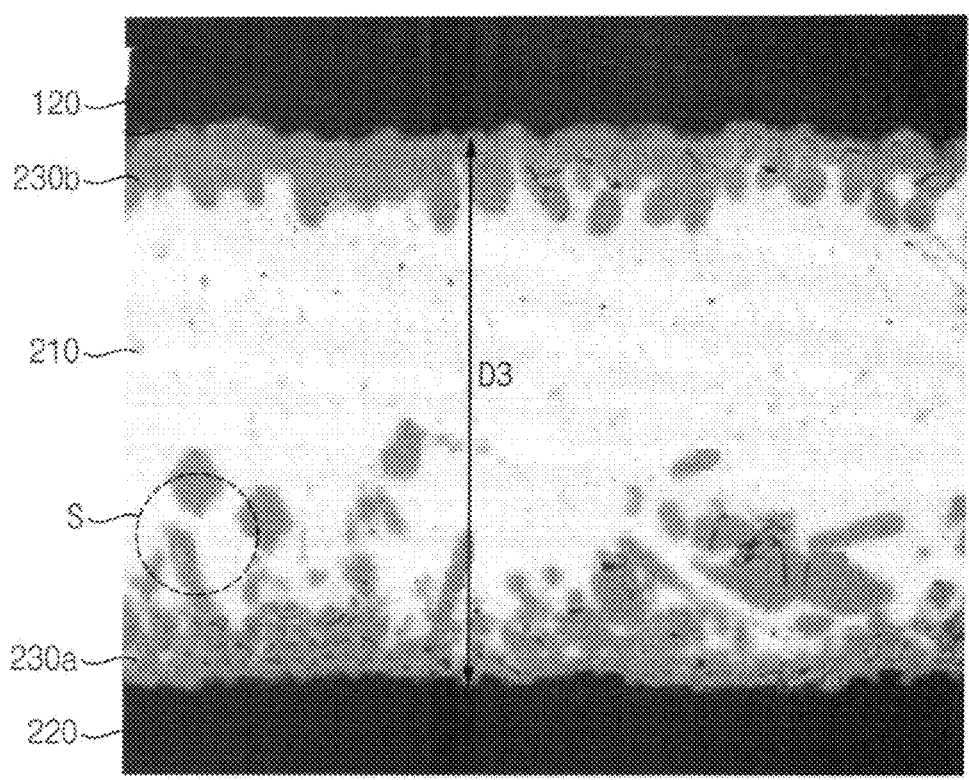
Figure 5:
Figure 6:
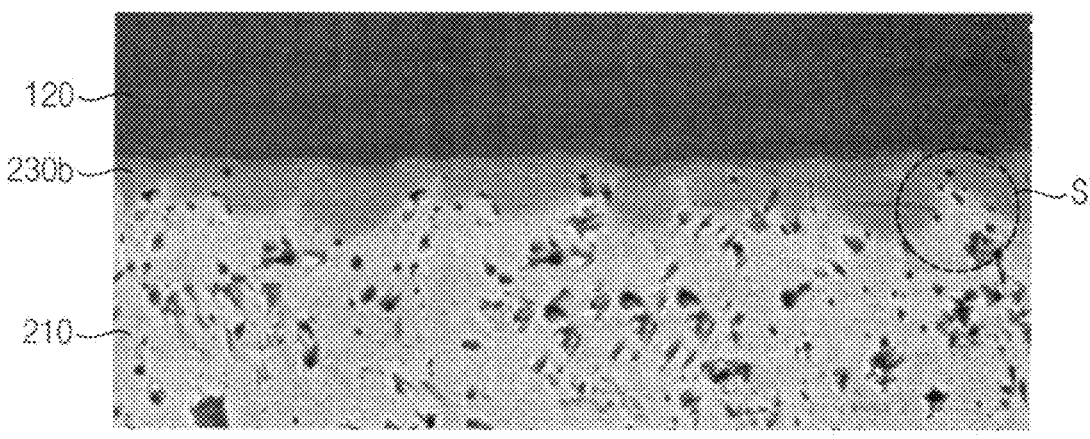
Figure 6:

FIG. 1 is a cross-sectional view illustrating a semiconductor package in accordance with example embodiments. FIG. 2 is an enlarged cross-sectional view illustrating portion 'A' in FIG. 1. FIG. 3 is an enlarged cross-sectional view illustrating portion 'B' in FIG. 2. FIG. 4 is an enlarged cross-sectional view illustrating portion 'C' in FIG. 3. FIG. 5 is an enlarged cross-sectional view illustrating portion 'D' in FIG. 4. FIG. 6 is an enlarged cross-sectional view illustrating portion 'E' in FIG. 4.

Referring to FIGS. 1 to 6, a semiconductor package 10 may include a package substrate 100 and at least one semiconductor device disposed on the package substrate 100. The semiconductor device may include a first semiconductor device 300 and a second semiconductor device 400.

In example embodiments, the semiconductor package 10 may be a memory device having a stacked chip structure in which a plurality of dies (chips) is stacked. For example, the semiconductor package 10 may include a semiconductor memory device with a 2.5D chip structure. In this case, the first semiconductor device 300 may include a logic semiconductor device, and the second semiconductor device 400 may include a memory device. The logic semiconductor device may be an ASIC as a host such as a central processing unit (CPU), a graphics processing unit (GPU), and a system on chip (SoC). The memory device may include a high bandwidth memory (HBM) device. Alternatively, the first and second semiconductor devices 300 and 400 may include an interposer. In this case, the first and second semiconductor devices 300 and 400 may include other memory devices disposed on the interposer.

The first and second devices 300 and 400 may be disposed on the package substrate 100. A planar area of the first and second devices 300 and 400 may be smaller than a planar area of the package substrate 100. In plan view, the first and second devices 300 and 400 may be disposed within the area of the package substrate 100. For example, in plan view, an area of the package substrate 100 may be greater than an area of both the first and second devices 300 and 400.

In example embodiments, the package substrate 100 may have an upper surface and a lower surface opposite each other, a plurality of bonding pads 120 provided on the lower surface of the package substrate 100, and a plurality of solder bumps 200 respectively disposed on the bonding pads 120. For example, the package substrate 100 may be a printed circuit board (PCB). The printed circuit board may be a multilayer circuit board having vias and various circuits therein.

The package substrate 100 may include a plurality of redistribution wirings 114 formed therein. The first semiconductor device 300 and the second semiconductor device 400 may be electrically connected to each other through the redistribution wirings 114 inside the package substrate 100 or may be electrically connected to another semiconductor device through the solder bumps 200. The package substrate 100 may provide high-density interconnection between the first and second semiconductor devices 300 and 400.

In example embodiments, the package substrate 100 may include a redistribution wiring layer 110 having the redistribution wirings 114. The package substrate 100 may include the bonding pads 120 provided to be exposed from the lower surface, that is, a first surface 102 of the redistribution wiring layer 110 and a plurality of pad patterns 130 provided to be exposed from the upper surface, that is, a second surface 104 of the redistribution wiring layer 110.

In example embodiments, the redistribution wiring layer 110 may include a plurality of insulating layers 112a, 112b, 112c and the redistribution wirings 114 provided in the insulating layers. The redistribution wirings 114 may include a first redistribution wiring 114a and a second redistribution wiring 114b. The insulating layer may include a polymer, a dielectric layer, etc. The insulating layer may be formed by a vapor deposition process, a spin coating process, etc. The redistribution wiring may include aluminum (Al), copper (Cu), tin (Sn), nickel (Ni), gold (Au), platinum (Pt) or an alloy thereof. The redistribution wiring may be formed by a plating process, an electroless plating process, a vapor deposition process, etc.

In particular, a plurality of the bonding pads 120 may be provided in the first insulating layer 112a. A lower surface of the bonding pad 120 may be provided to be exposed from the lower surface of the first insulating layer 112a, that is, the first surface 102. The first insulating layer 112a may have first openings that expose upper surfaces of the bonding pads 120.

The first redistribution wiring 114a may be formed on the first insulating layer 112a and may contact the bonding pads 120 through the first openings. The second insulating layer 112b may be formed on the first insulating layer 112a and may have second openings that expose the first redistribution wiring 114a.

The second redistribution wiring 114b may be formed on the second insulating layer 112b and may contact the first redistribution wiring 114a through the second openings. The third insulating layer 112c may be formed on the second insulating layer 112b and may have third openings that expose the second redistribution wiring 114b.

The pad pattern 130 may be formed on the third insulating layer 112c and may contact the second redistribution wiring 114b through the third openings. Accordingly, a plurality of the pad patterns 130 may be provided to be exposed from an upper surface of the third insulating layer 112c, that is, the second surface 104.

The bonding pads 120 and the pad pattern 130 may include a first metal material. For example, the first metal material may include a conductive material such as copper (Cu), aluminum (Al), titanium (Ti), or an alloy thereof.

In example embodiments, the first semiconductor device 300 may be arranged on the package substrate 100. The first semiconductor device 300 may be mounted on the package substrate 100 by a flip chip bonding manner. In this case, the first semiconductor device 300 may be mounted on the package substrate 100 such that an active surface on which chip pads 310 are formed faces the package substrate 100. The chip pads 310 of the first semiconductor device 300 may be electrically connected to the bonding pads 120 of the package substrate 100 by conductive bumps 320 as conductive connection members. For example, the conductive bumps 320 may include micro bumps (uBump).

The second semiconductor device 400 may be arranged on the package substrate 100 to be spaced apart from the first semiconductor device 300. The second semiconductor device 400 may be mounted on the package substrate 100 by a flip chip bonding manner. In this case, the second semiconductor device 400 may be mounted on the package substrate 100 such that an active surface on which chip pads 410 are formed faces the package substrate 100. The chip pads 410 of the second semiconductor device 400 may be electrically connected to the bonding pads 120 of the package substrate 100 by conductive bumps 420. For example, the conductive bumps 420 may include micro bumps (uBump).

The first and second semiconductor devices 300 and 400 may be arranged on the package substrate 100 to be spaced apart from each other. A sealing member 500 may be provided on the package substrate 100 to cover the first and second semiconductor devices 300 and 400. Upper surfaces of the first and second semiconductor devices 300 and 400 may be provided to be exposed by the sealing member 500. The sealing member may include an epoxy mold compound (EMC).

Although one first semiconductor device 300 and one second semiconductor device 400 are illustrated in the figures, embodiments may not be limited thereto. For example, the second semiconductor device 400 may include a buffer die and a plurality of memory dies (chips) sequentially stacked on the buffer die.

Although only some substrates, some bonding pads, and some wirings are illustrated in the drawings, it may be understood that the number and arrangement of the substrates, the bonding pads, and the wirings are exemplary, and it may be not limited thereto. Since the wirings as well as the substrates are well known in the art to which the present inventive concept pertains, illustration and description concerning the above elements will be omitted.

In example embodiments, the solder bump 200 may include a bump body 210, a plurality of bonding particles 220 provided inside the bump body 210 to be adjacent to the bonding pad 120, and a metal compound layer 230 provided to surround each of the bonding particles 220 and having a protrusion structure S for strengthening bonding with the bonding pad 120. The package substrate 100 may be mounted on another electronic device through the solder bumps 200 as conductive connecting members. The solder bump 200 may be provided on the bonding pad 120. For example, the solder bump 200 may contact the bonding pad 120. For example, the solder bump 200 may include a C4 bump. The term "contact," as used herein, refers to a direct connection (i.e., touching) unless the context indicates otherwise.

The solder bump 200 may be attached to the bonding pad 120 provided on the first surface 102 of the package substrate 100 by a solder ball attach process. In this case, solder balls may be attached to a suction head and portions of the solder balls may be coated with a flux F (see, e.g., FIGS. 20-22). The flux F may cause effects such as oxidation prevention, cleaning, and the like, and thus, the solder balls may be more easily attached to the bonding pads 120 to be the solder bumps 200.

The solder bump 200 may include a second metal material different from the first metal material. The second metal material may include nickel (Ni), molybdenum (Mo), titanium (Ti), gold (Au), silver (Ag), chromium (Cr), tin (Sn), etc. For example, the solder bump 200 may include tin (Sn), and in this case, the flux F may include nickel (Ni) particles. After the solder ball attachment process is completed, the nickel particles Ni may become the bonding particles 220 to be described later, so that the solder bump 200 may be more strongly adhered to the bonding pad 120.

As illustrated in FIGS. 3 to 6, the bonding particles 220 may be provided inside the bump body 210. For example, the bump body 210 may have a first diameter D1, and the first diameter D1 may be within a range of 10 μm to 1000 μm. In example embodiments, the first diameter D1 may be a maximum diameter of the bump body 210.

The bonding particles 220 may be provided adjacent to the bonding pad 120 inside the bump body 210. For example, the bonding particles 220 may be provided in an upper half of the bump body 210. The bonding particles 220 may be particles formed in a process of manufacturing the package substrate 100. Specifically, the bonding particles 220 may be added to the flux F during the process of manufacturing the package substrate 100. The bonding particles 220 may strengthen a bonding force between the solder bump 200 and the bonding pad 120 by creating the metal compound layer 230 to be described later, so that the bump body 210 may be more strongly adhered to the bonding pad 120.

Each of the bonding particles 220 may have a second diameter D2. The second diameter D2 may be a maximum diameter of the bonding particle 220. A ratio (D2/D1) of the second diameter D2 to the first diameter D1 may be within a range of 0.005 to 0.15. A distance D3 between the bonding particle 220 and the bonding pad 120 may be within a range of 0.1 μm to 30 μm. In example embodiments, a distance D3 between each of the bonding particles 220 and the bonding pad 120 may be within a range of 0.1 μm to 30 μm.

The bonding particles 220 may include a third metal material different from the second metal material. The third metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), etc.

The metal compound layer 230 may include a first metal compound layer 230a and a second metal compound layer 230b. The metal compound layer 230 may be formed by a chemical reaction between the bump body 210 and the bonding particles 220. For example, the metal compound layer 230 may include a copper nickel tin compound ((Cu, Ni)$_6$Sn$_5$). In this case, the chemical reaction in which metal compound layer 230 is formed may be expressed by Equation (1) below.

$$5Sn + 6xNi + 6(1-x)Cu \rightarrow (Cu_x, Ni_{1-x})_6 Sn_5 + \Delta H_m \qquad \text{Equation (1):}$$

The metal compound layer 230 may have the protrusion structure S. The protrusion structure S may be formed by a chemical reaction of the bonding particles 220 in a thermo-compression process for attaching the solder bump 200 to the bonding pad 120. Since the protrusion structure S has a shape causing an anchor effect, the bonding force between the solder bump 200 and the bonding pad 120 may be strengthened.

The first metal compound layer 230a may be provided to surround the bonding particles 220. The first metal compound layer 230a may be more actively formed at a position where the solder bump 200 and the bonding pad 120 are adjacent to each other.

The second metal compound layer 230b may be provided along a contact area between the solder bump 200 and the bonding pad 120 inside the solder bump 200. The second metal compound layer 230b may be more actively formed at the position where the solder bump 200 and the bonding pad 120 are adjacent to each other. For example, the second metal compound layer 230b may be more actively formed in a region where the solder bump 200 and the bonding pad 120 contact one another. Since the second metal compound layer 230b is formed at a location spaced apart from the bonding particles 220, the bonding force between the solder bump 200 and the bonding pad 120 may be strengthened in a wide range.

The metal compound layer 230 may prevent formation of interfering particles that weaken the bonding force between the solder bump 200 and the bonding pad 120. The interfering particles may be formed between the solder bump 200 and the bonding pad 120 in the thermo-compression process for attaching the solder bump 200 to the bonding pad 120. The interfering particles may weaken elastic modulus and strength of the metal compound layer 230. For example, the interfering particles may include $Cu_3Sn$.

Figure 7A:
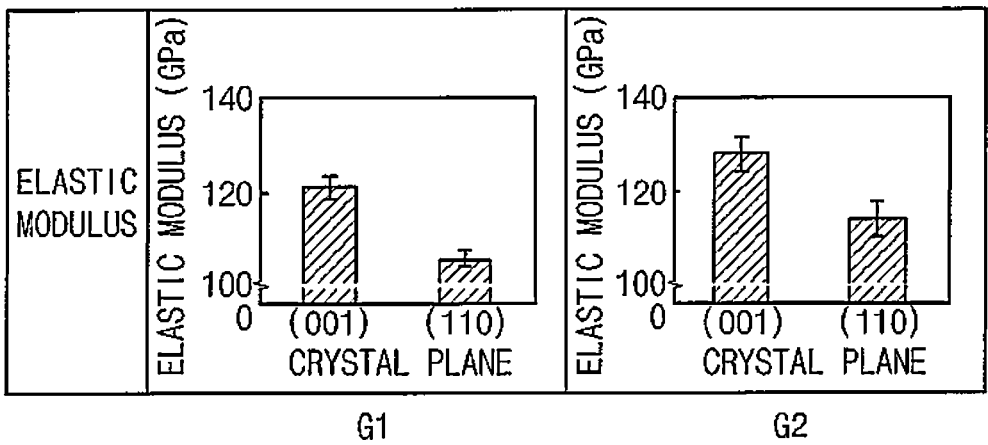
FIGS. 7A and 7B are graphs showing differences in elastic modulus and hardness, respectively, in accordance with a type of a metal compound layer.
Figure 7B:
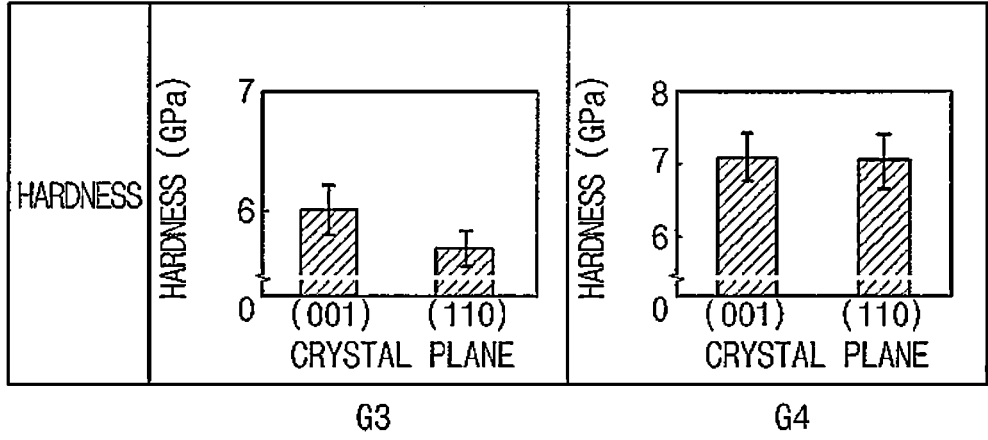

FIGS. 7A and 7B are graphs showing a difference in elastic modulus and hardness, respectively, in accordance with a type of a metal compound layer.

Referring to FIG. 7A, an elastic modulus between the solder bump 200 and the bonding pad 120 may vary depending on the metal compound layer 230 and a composition thereof. The left bar graph (001) shown in each of the graphs may represent the elastic modulus in a third direction indicating a direction between the solder bump 200 and the bonding particle 220, and the right bar graph (110) shown in each of the graphs may represent the elastic modulus in first and second directions orthogonal to the third direction and perpendicular to each other.

A first graph G1 represents the elastic modulus between the solder bump 200 and the bonding pad 120 when the metal compound layer (IMC, $Cu_6Sn_5$) is formed without including nickel (Ni). A second graph G2 represents the elastic modulus between the solder bump 200 and the bonding pad 120 when the metal compound layer ((Cu, Ni)$_6$Sn$_5$) is formed. Thus, the elastic modulus may be increased relatively when the metal compound layer ((Cu, Ni)$_6$Sn$_5$) including the nickel (Ni) is formed.

Referring to FIG. 7B, hardness between the solder bump 200 and the bonding pad 120 may vary depending on the metal compound layer 230 and the interfering particles.

A third graph G3 represents the hardness between the solder bump 200 and the bonding pad 120 when the metal compound layer (IMC, $Cu_6Sn_5$) is formed without including nickel (Ni). A fourth graph G4 represents the hardness between the solder bump 200 and the bonding pad 120 when the metal compound layer ((Cu, Ni)$_6$Sn$_5$) is formed. Thus, the hardness may be increased relatively when the metal compound layer ((Cu, Ni)$_6$Sn$_5$) including the nickel (Ni) is formed.

Figure 8A:
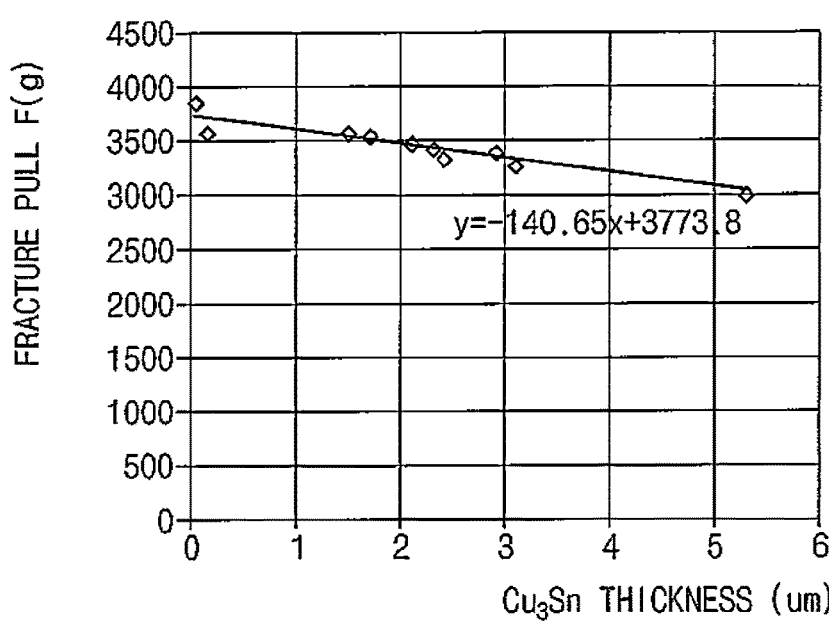
FIG. 8A is a graph showing a degree of ductile fracture in accordance with a thickness of $Cu_3Sn$.
Figure 8B:
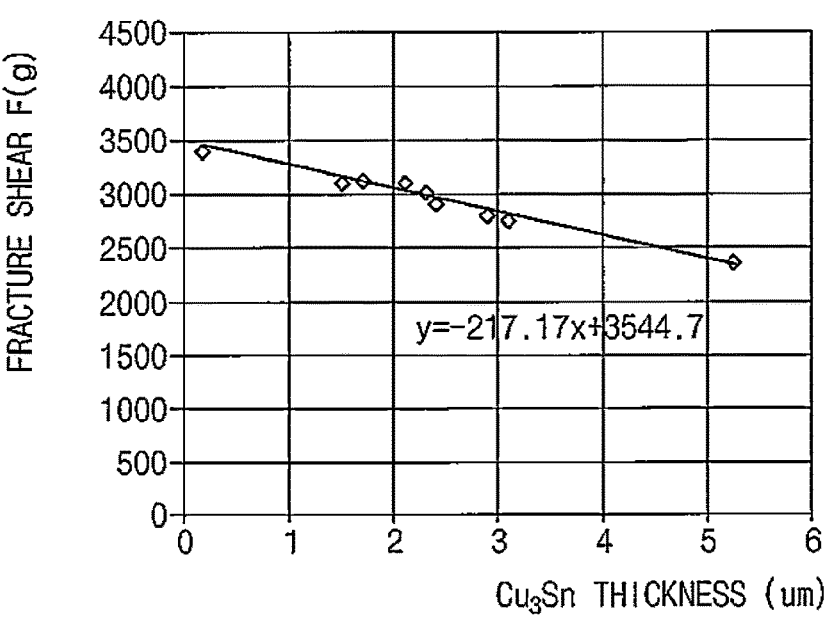
FIG. 8B is a graph showing a degree of shear failure in accordance with a thickness of $Cu_3Sn$.

FIG. 8A is a graph showing a degree of ductile fracture in accordance with a thickness of $Cu_3Sn$. FIG. 8B is a graph showing a degree of shear failure in accordance with a thickness of $Cu_3Sn$.

Referring to FIG. 8A, the X-axis represents a thickness of the interfering particle ($Cu_3Sn$), and the Y-axis represents a degree of ductile fracture between the solder bump 200 and the bonding pad 120. The ductile fracture may refer to a case in which, when a tensile force is applied between the solder bump 200 and the bonding pad 120a, a fracture occurs by sliding along a surface while continuously undergoing large deformation. As the thickness of the interfering particles $Cu_3Sn$ increases, the degree of the ductile fracture endured between the solder bump 200 and the bonding pad 120 may be reduced.

Referring to FIG. 8B, the X-axis represents the thickness of the interfering particles ($Cu_3Sn$), and the Y-axis represents a degree of shear fracture between the solder bump 200 and the bonding pad 120. The shear fracture may be a failure due to cracks generated by shear stress. As the thickness of the interfering particles ($Cu_3Sn$) increases, the degree of the shear fracture endured between the solder bump 200 and the bonding pad 120 may be reduced.

Accordingly, as the thickness of the interfering particles ($Cu_3Sn$) increases, the bonding force between the solder bump 200 and the bonding pad 120 may be weakened, and the ductile fracture and the shear fracture may occur more easily.

As described above, the bonding particles 220 may be provided between the bonding pad 120 and the solder bump 200, since the metal compound layer 230 surrounding the bonding particles 220 or provided to be in contact with the bonding pad 120 has the protrusion structure S, the bonding force between the bonding pad 120 and the solder bump 200 may be strengthened. Thus, the solder bumps 200 may be stably adhered to the package substrate 100 without being separated from the bonding pad 120.

Hereinafter, a method of manufacturing the semiconductor package in FIG. 1 will be explained.

FIGS. 9 to 26 are cross-sectional views illustrating a method of manufacturing a semiconductor package in accordance with example embodiments.

Referring to FIGS. 9 to 12, a package substrate 100 having a plurality of bonding pads 120 provided thereon may be formed.

Figure 9:
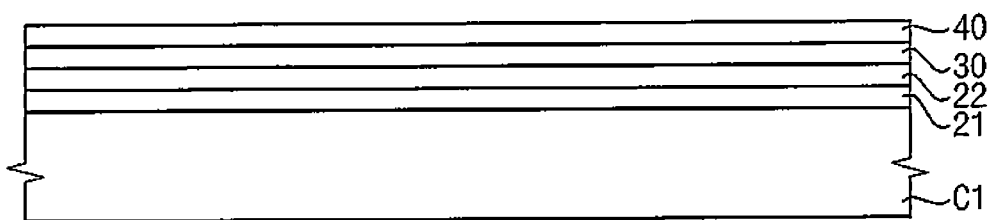

As illustrated in FIG. 9, a release tape 21, a barrier metal layer 22, a seed layer 30, and a photoresist layer 40 may be sequentially formed on a carrier substrate C1. For example, the seed layer 30 may include copper (Cu), aluminum (Al), titanium (Ti), or an alloy thereof. The seed layer 30 may be formed by a sputtering process.

Figure 10:
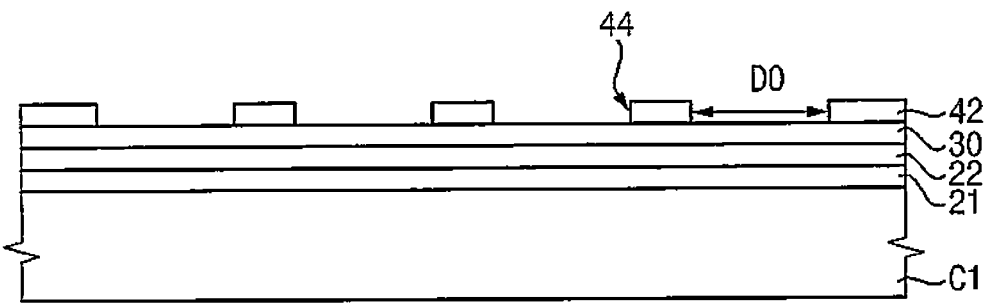

Then, as illustrated in FIG. 10, an exposure process may be performed on the photoresist layer 40 to form a photoresist pattern 42 having openings 44 that expose a bonding pad region. For example, a diameter DO of each of the openings 44 may be within a range of 10 μm to 800 μm.

Figure 11:
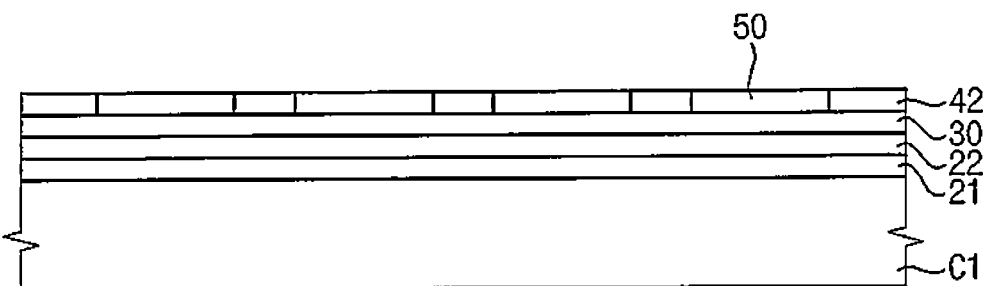

Then, as illustrated in FIG. 11, a plating process may be performed on the seed layer 30 to form a metal pattern 50 including a first metal material. The plating process may include an electro plating process or an electroless plating process. For example, the first metal material may include copper (Cu), aluminum (Al), titanium (Ti), or an alloy thereof. The first metal material may include the same material as the seed layer 30.

Figure 12:
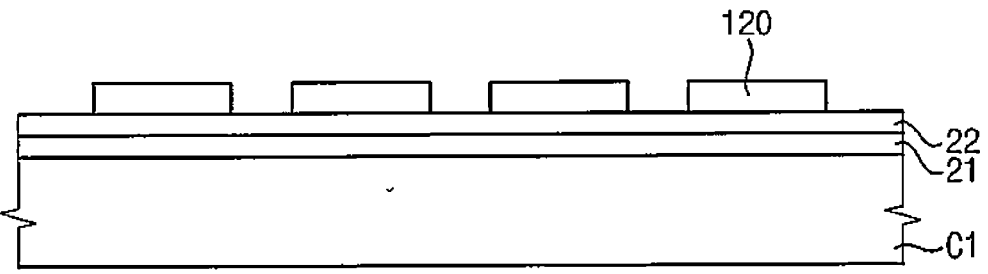

As illustrated in FIG. 12, the photoresist pattern 42 may be removed to form a preliminary bonding pad 120 including the metal patterns 50 on the seed layer 30. A portion of the metal pattern 50 may be removed by a wet etching process. In this case, portions of the seed layer 30 exposed by the metal patterns 50 may be removed together. The wet etching process may be performed using an etchant. The etchant may include water ($H_2O$), hydrogen peroxide ($H_2O_2$), citric acid ($C_6H_8O_7$), etc.

Referring to FIGS. 13 to 18, a redistribution wiring layer 110 having redistribution wirings 114 electrically connected to the bonding pads 120 may be formed.

Figure 13:
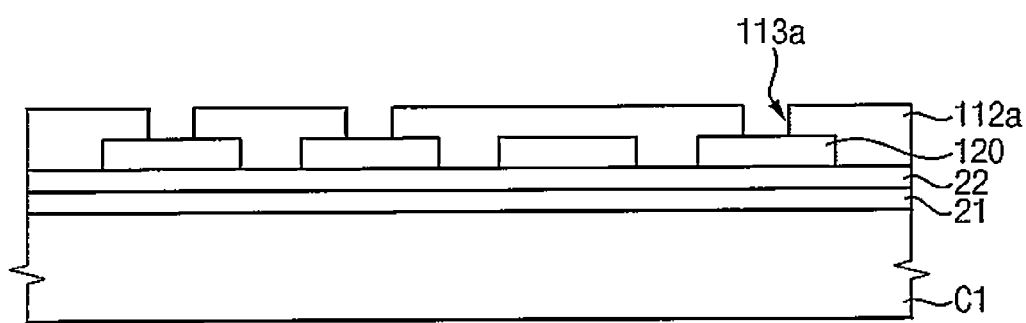

As illustrated in FIG. 13, after a first insulating layer 112a is formed on the barrier metal layer 22 to cover the bonding pads 120, the first insulating layer 112*a* may be patterned to form first openings 113*a* that expose portions of the bonding pads 120 respectively.

For example, the first insulating layer 112*a* may include a polymer, a dielectric layer, etc. In particular, the first insulating layer 112*a* may include polyimide (PI), lead oxide (PbO), polyhydroxystyrene (PHS), novolac (NOVOLAC), etc. The first insulating layer 112*a* may be formed by a vapor deposition process, a spin coating process, etc.

Figure 14:
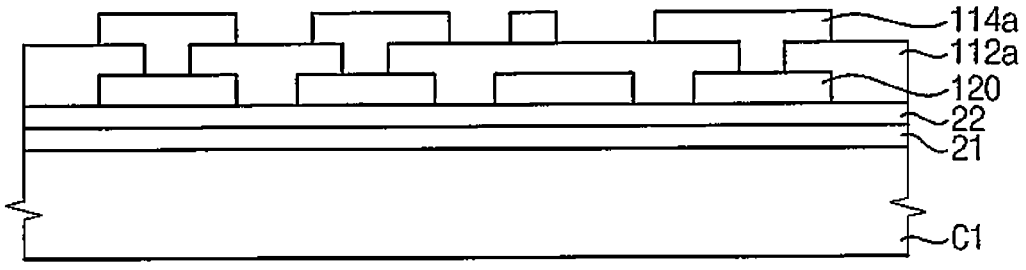

As illustrated in FIG. 14, a first redistribution wiring 114*a* may be formed on the first insulating layer 112*a* to be electrically connected to the bonding pad 120 through the first opening.

The first redistribution wiring 114*a* may be formed by forming a seed layer on a portion of the first insulating layer 112*a* and in the first opening, patterning the seed layer and performing an electroplating process. Accordingly, at least a portion of the first redistribution wiring 114*a* may directly contact the bonding pad 120 through the first opening.

For example, the first redistribution wiring 114*a* may include aluminum (Al), copper (Cu), tin (Sn), nickel (Ni), gold (Au), platinum (Pt), or an alloy thereof.

Figure 15:
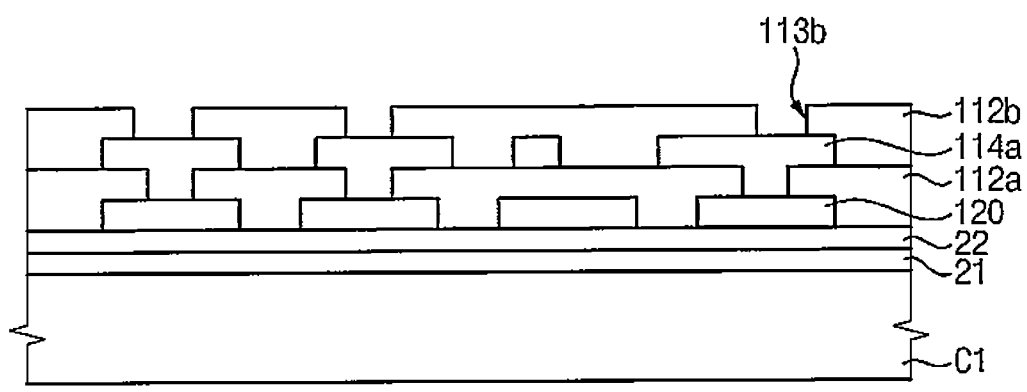

As illustrated in FIG. 15, after a second insulating layer 112*b* is formed on the first insulating layer 112*a* to cover the first redistribution wirings 114*a*, the second insulating layer 112*b* may be patterned to form second openings 113*b* that expose the first redistribution wiring 114*a*.

Figure 16:
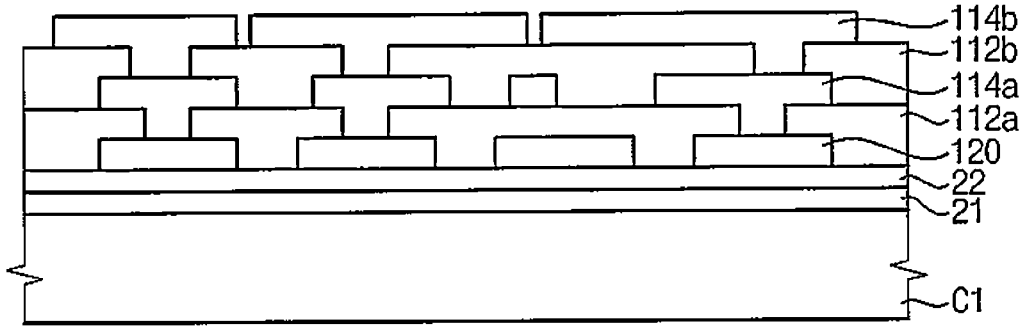

As illustrated in FIG. 16, a second redistribution wiring 114*b* may be formed on the second insulating layer 112*b* to be electrically connected to the first redistribution wiring 114*a* through the second openings 113*b*.

Figure 17:
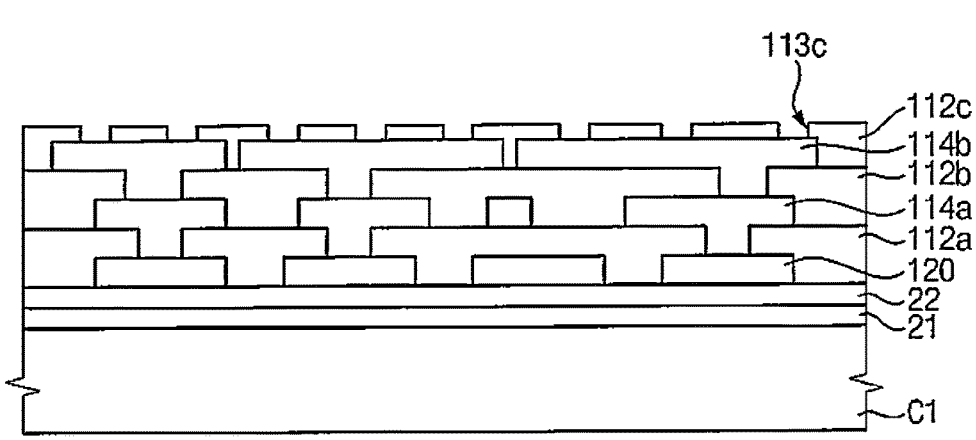

As illustrated in FIG. 17, after a third insulating layer 112*c* is formed on the second insulating layer 112*b* to cover the second redistribution wiring 114*b*, the third insulating layer 112*c* may be patterned to form third openings 113*c* that expose the second redistribution wiring 114*b*.

Figure 18:
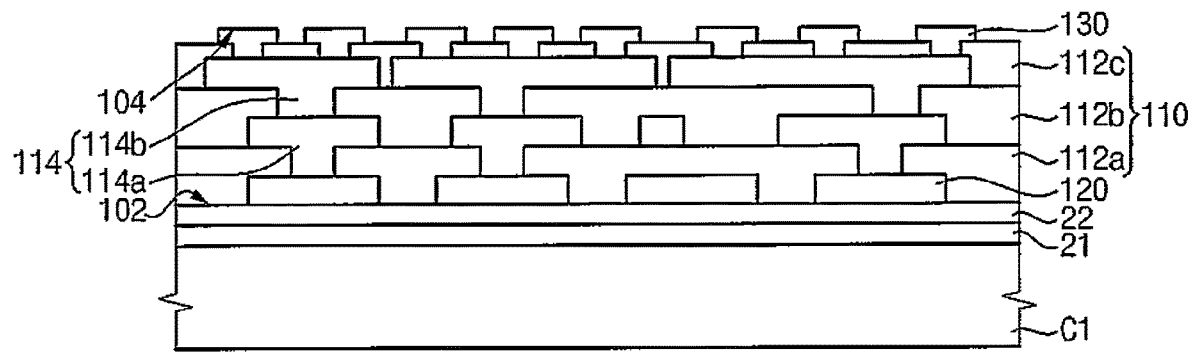

As illustrated in FIG. 18, a plurality of pad patterns 130 may be formed on the third insulating layer 112*c* to directly contact the second redistribution wirings 114*b* through the third openings 113*c*.

Thus, the redistribution wiring layer 110 including the redistribution wirings 114 may be formed. A plurality of the bonding pads 120 may be formed on a lower surface, that is, a first surface 102 of the redistribution wiring layer 110. A plurality of the pad patterns 130 may be formed on an upper surface, that is, a second surface 104 of the redistribution wiring layer 110.

Referring to FIGS. 19 to 26, solder bumps 200 may be formed on the bonding pads 120 of the redistribution wiring layer 110. The solder ball 20 may be attached to the bonding pad 120 provided on the first surface 102 of the package substrate 100 by a solder ball attach process to form the solder bump 200.

Figure 19:
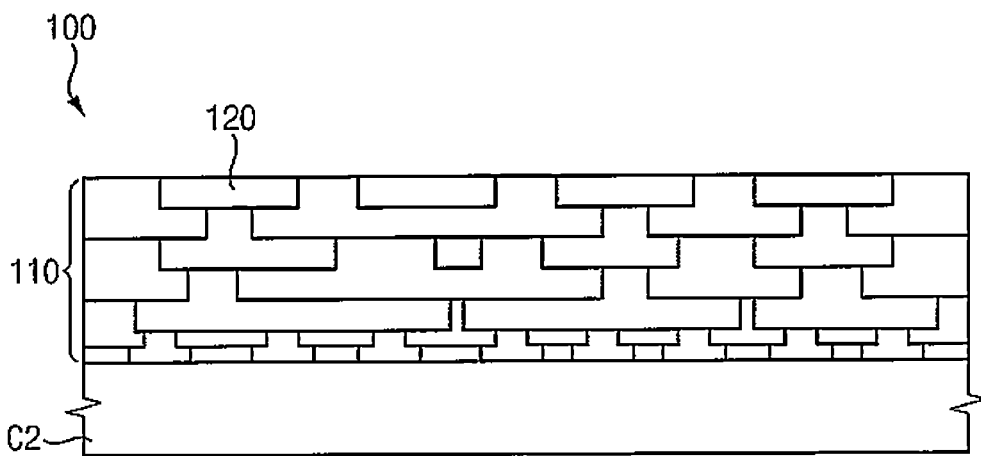

As illustrated in FIG. 19, after attaching a carrier substrate C2 on the second surface 104 of the redistribution wiring layer 110, the structure to which the carrier substrate C2 is attached may be turned over, and the barrier metal layer 22 and the carrier substrate C1 may be removed. In this case, the seed layer 30 may be also removed so that the bonding pads 120 may be exposed from the first surface 102 of the redistribution wiring layer 110.

Figure 20:
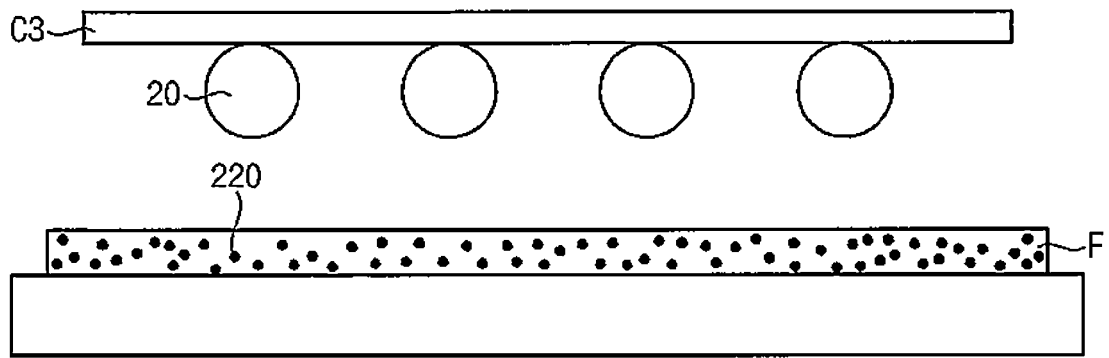

As illustrated in FIG. 20, the solder balls 20 may be attached to a suction head C3 in a preset arrangement. The preset arrangement may be the same as an arrangement of the bonding pads 120 of the package substrate 100.

Figure 21:
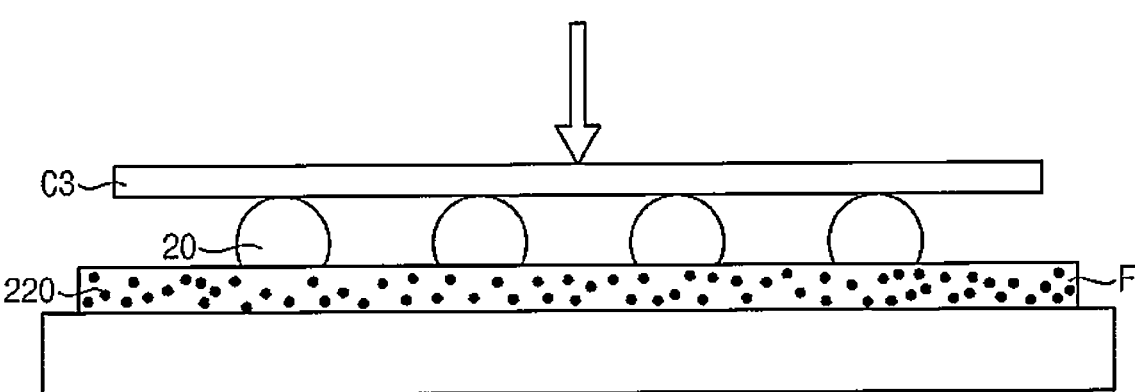

As illustrated in FIG. 21, the suction head C3 by which the solder balls 20 are held may descend and bring the solder balls 20 to come into contact with a flux F. The flux F may allow the solder ball 20 to more easily adhere to the bonding pad 120 through oxidation prevention, cleaning, or the like. For example, the flux F may include a plurality of bonding particles 220. The bonding particles may include nickel (Ni) particles.

Figure 22:
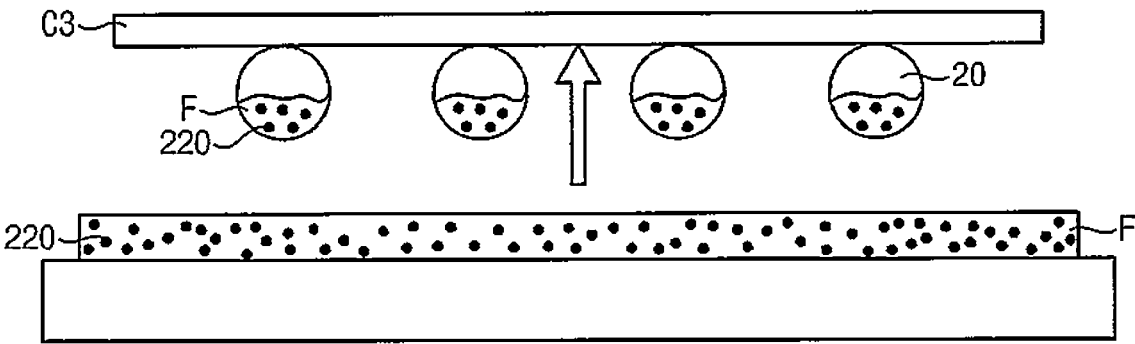

As illustrated in FIG. 22, the suction head C3 may raise the solder balls 20 on which the flux F is coated. Accordingly, the solder balls 20 may include the flux F coated thereon and the bonding particles 220 in the flux F.

Figure 23:
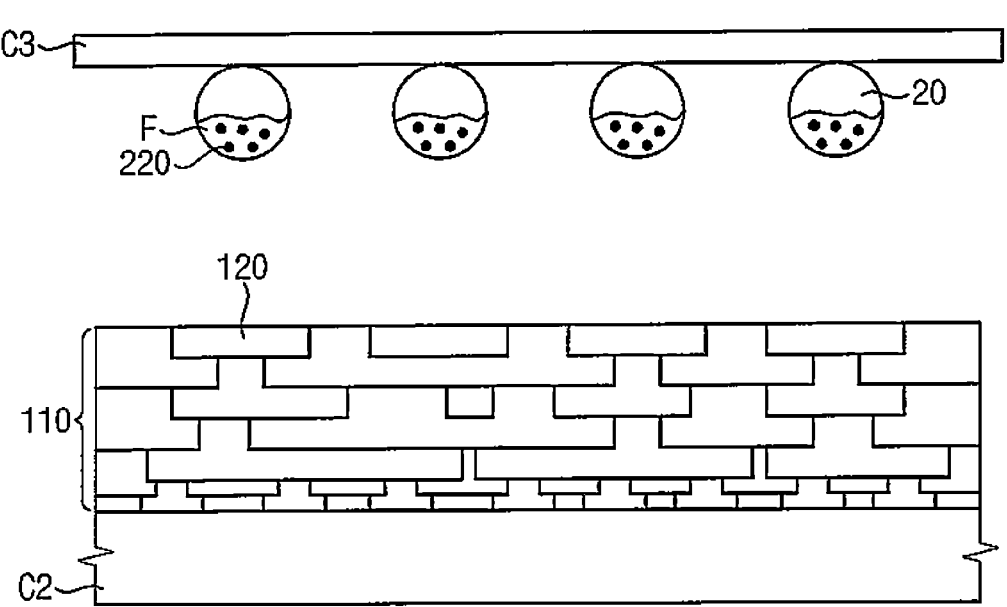
Figure 24:
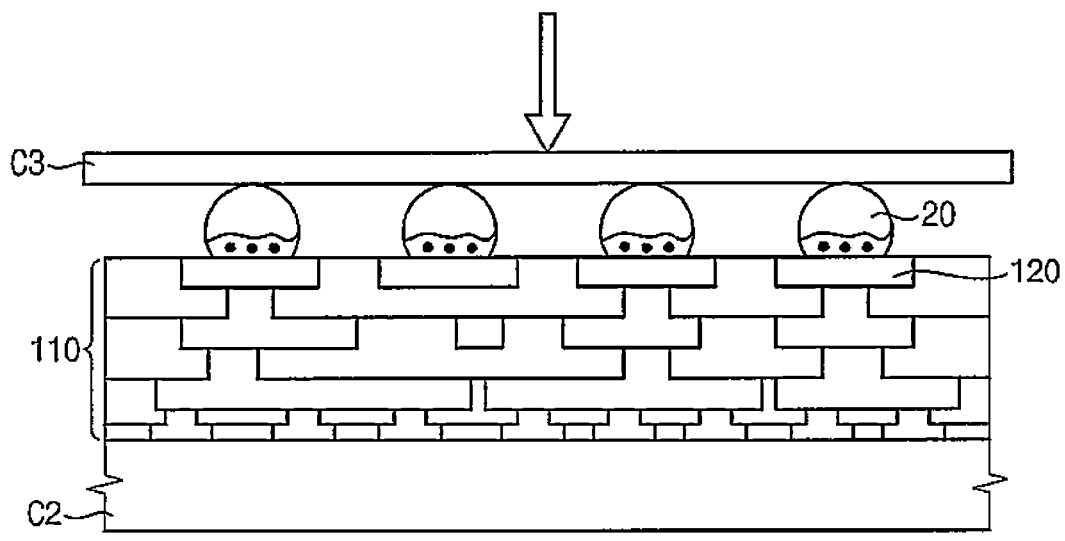
Figure 25:
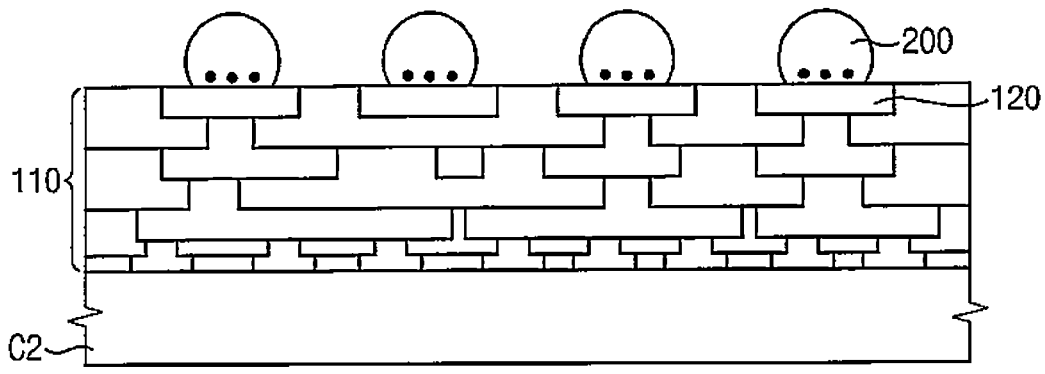

As illustrated in FIGS. 23 to 25, the suction head C3 may attach the solder balls 20 to the bonding pads 120 of the package substrate 100. After the solder ball 20 comes into contact with the bonding pad 120 by the suction head C3, the solder ball 20 may be attached to the bonding pad 120 by a thermo-compression process.

Since a density of a third metal material constituting the bonding particles 220 is higher than a density of a second metal material constituting the solder ball 20 in the thermo-compression process, the bonding particles 220 may be formed adjacent to the bonding pad 120.

While the solder ball 20 is attached to the bonding pad 120 by the thermo-compression process, the solder ball 20, the bonding pad 120, and the bonding particles 220 may generate a chemical reaction. A metal compound layer may be formed between the solder ball 20, the bonding pad 120, and the bonding particles 220 through the chemical reaction. The metal compound layer may include a protrusion structure to strengthen a bonding force between the solder bump 200 and the bonding pad 120. For example, the metal compound layer may include a copper nickel tin compound ($(Cu, Ni)_6Sn_5$). In this case, the chemical reaction in which the metal compound layer 230 is formed may be expressed by Equation (1) below.

$$5Sn + 6xNi + 6(1-x)Cu \rightarrow (Cu_x, Ni_{1-x})_6 Sn_5 + \Delta H_m \qquad \text{Equation (1):}$$

Figure 26:
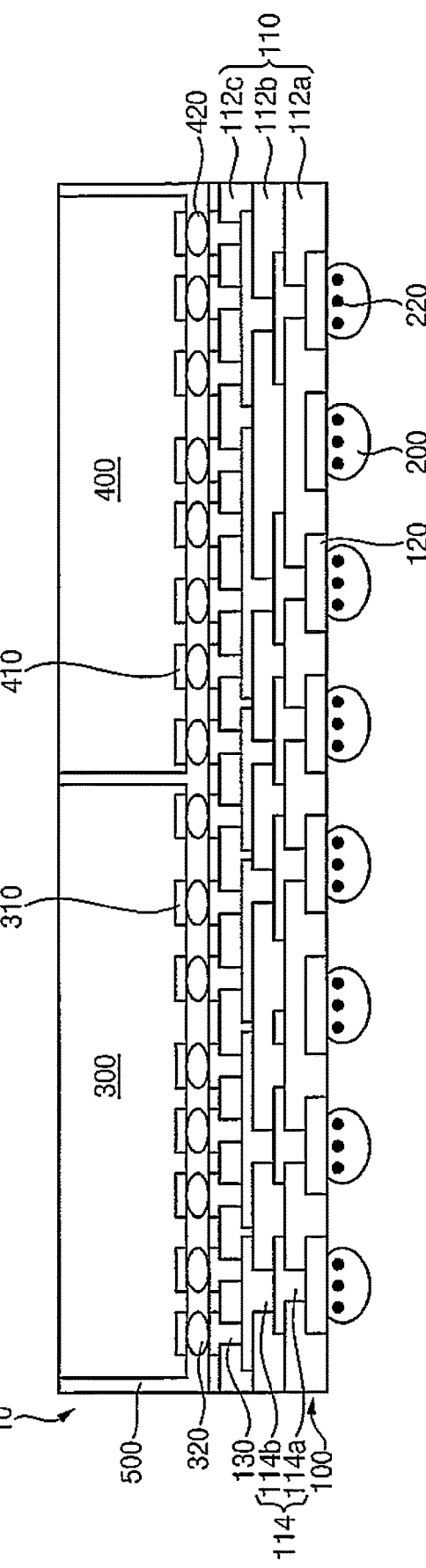

Referring to FIG. 26, the redistribution wiring layer 110 may be cut to form the package substrate 100, and first and second semiconductor devices 300 and 400 may be disposed on a package substrate 100 (see FIG. 1) to complete the semiconductor package 10 in FIG. 1.

After the first semiconductor device 300 and the second semiconductor device 400 are mounted on the redistribution wiring layer 110, a sealing member 500 may be formed on the redistribution wiring layer 110 to cover the first semiconductor device 300 and the second semiconductor device. The first semiconductor device 300 and the second semiconductor device 400 may be arranged on the redistribution wiring layer 110 to be spaced apart from each other.

In example embodiments, the first and second semiconductor devices 300 and 400 may be mounted on the redistribution wiring layer 110 in a flip chip bonding manner. Chip pads 310 of the first semiconductor device 300 may be electrically connected to the pad patterns 130 of the redistribution wiring layer 110 by conductive bumps 320. Chip pads 410 of the second semiconductor device 400 may be electrically connected to the pad patterns 130 of the redistribution wiring layer 110 by conductive bumps 420. For example, the conductive bumps 320 and 420 may include micro bumps (uBump).

For example, the first and second semiconductor devices 300 and 400 may include interposers having other semiconductor devices. Alternatively, the first semiconductor device 300 may include a logic semiconductor device, and the second semiconductor device may include a memory device. The logic semiconductor device may be an ASIC as a host such as a CPU, GPU, or SoC. The memory device may include a high bandwidth memory (HBM) device. In this case, the second semiconductor device may include a buffer die and a plurality of memory dies (chips) sequentially stacked on the buffer die. The buffer die and the memory dies may be electrically connected to each other by through silicon vias.

For example, the sealing member 500 may include an epoxy mold compound (EMC). The sealing member 500 may be formed to expose upper surfaces of the first and second semiconductor devices.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a package substrate having a first surface and a second surface opposite to the first surface, the package substrate including a plurality of bonding pads exposed from the first surface and a plurality of solder bumps respectively disposed on the plurality of bonding pads; and
at least one semiconductor device arranged on the package substrate,
wherein each of the plurality of solder bumps includes:
a bump body disposed on the bonding pad;
a plurality of bonding particles provided inside the bump body to be adjacent to the bonding pad; and
a first metal compound layer provided to surround the plurality of bonding particles, the first metal compound layer having a protrusion structure for strengthening adhesion with the bonding pad, and
wherein, in each of the plurality of solder bumps, a density of the plurality of bonding particles is greater in a region of the solder bump adjacent to the bonding pad than in a region near a center of the solder bump.

2. The semiconductor package of claim 1, wherein the package substrate further includes redistribution wirings that electrically connect the semiconductor device to the bonding pads.

3. The semiconductor package of claim 1, wherein each of the plurality of solder bumps further includes a second metal compound layer provided along a boundary between the bonding pad and the bump body for strengthening adhesion.

4. The semiconductor package of claim 1,
wherein the bump body has a first diameter,
wherein each of the plurality of bonding particles has a second diameter, and
wherein a ratio of the second diameter to the first diameter is within a range of 0.005 to 0.15.

5. The semiconductor package of claim 1, wherein a distance between the plurality of bonding particles and the bonding pad is within a range of 0.1 μm to 30 μm.

6. The semiconductor package of claim 1,
wherein the bonding pad includes a first metal material,
wherein the bump body includes a second metal material different from the first metal material, and

wherein the plurality of bonding particles include a third metal material different from the second metal material.

7. The semiconductor package of claim 6, wherein the first metal material includes at least one of copper (Cu), aluminum (Al), and titanium (Ti).

8. The semiconductor package of claim 6, wherein the second metal material includes at least one of nickel (Ni), molybdenum (Mo), titanium (Ti), gold (Au), silver (Ag), chromium (Cr), and tin (Sn).

9. The semiconductor package of claim 6, wherein the third metal material includes at least one of nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

10. The semiconductor package of claim 1,
wherein the plurality of solder bumps include tin (Sn),
wherein the plurality of bonding particles include nickel (Ni), and
wherein the first metal compound layer includes (Cu, Ni)$_6$Sn$_5$.

11. A semiconductor package, comprising:
a package substrate having a first surface and a second surface opposite to the first surface, the package substrate including a redistribution wiring layer having redistribution wiring therein, a plurality of bonding pads exposed from the first surface and a plurality of solder bumps respectively disposed on the plurality of bonding pads; and
first and second semiconductor devices arranged on the second surface of the package substrate to be spaced apart from each other,
wherein each of the plurality of solder bumps includes:
a bump body disposed on the bonding pad;
a plurality of bonding particles provided adjacent to the bonding pad; and
a first metal compound layer provided to surround the plurality of bonding particles, the first metal compound layer having a protrusion structure for strengthening adhesion with the bonding pad, and
wherein, in each of the plurality of solder bumps, a density of the plurality of bonding particles is greater in a region of the solder bump adjacent to the bonding pad than in a region near a center of the solder bump.

12. The semiconductor package of claim 11, wherein each of the plurality of solder bumps further includes a second metal compound layer provided along a boundary between the bonding pad and the solder bump for strengthening adhesion.

13. The semiconductor package of claim 11,
wherein the bump body has a first diameter,
wherein each of the plurality of bonding particles has a second diameter, and
wherein a ratio of the second diameter to the first diameter is within a range of 0.005 to 0.15.

14. The semiconductor package of claim 11, wherein a distance between the plurality of bonding particles and the bonding pad is within a range of 0.1 μm to 30 μm.

15. The semiconductor package of claim 11,
wherein the plurality of bonding pads include a first metal material,
wherein the bump body includes a second metal material different from the first metal material, and
wherein the plurality of bonding particles include a third metal material different from the second metal material.

16. The semiconductor package of claim 15, wherein the first metal material includes at least one of copper (Cu), aluminum (Al), and titanium (Ti).

17. The semiconductor package of claim 15, wherein the second metal material includes at least one of nickel (Ni), molybdenum (Mo), titanium (Ti), gold (Au), silver (Ag), chromium (Cr), and tin (Sn).

18. The semiconductor package of claim 15, wherein the third metal material includes at least one of nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

19. The semiconductor package of claim 11,
wherein the plurality of solder bumps include tin (Sn),
wherein the plurality of bonding particles include nickel (Ni), and
wherein the first metal compound layer includes (Cu, $Ni)_6Sn_5$.

20. A semiconductor package, comprising:
a package substrate having a first surface and a second surface opposite to the first surface, the package substrate including a redistribution wiring layer having redistribution wiring therein, a plurality of bonding pads exposed from the first surface, and a plurality of solder bumps respectively disposed on the plurality of bonding pads; and
first and second semiconductor devices arranged on the second surface of the package substrate,
wherein each of the plurality of solder bumps includes:
a bump body disposed on the bonding pad;
a plurality of bonding particles provided adjacent to the bonding pad;
a first metal compound layer provided to surround the plurality of bonding particles; and
a second metal compound layer provided to be in contact with the bonding pad, wherein the first metal compound layer includes (Cu, $Ni)_6Sn_5$,
wherein, in each of the plurality of solder bumps, a density of the plurality of bonding particles is greater in a region of the solder bump adjacent to the bonding pad than in a region near a center of the solder bump, and
wherein the first and second metal compound layers include a protrusion structure for strengthening adhesion between the plurality of bonding pads and the plurality of solder bumps.

* * * * *